United States Patent
Cohen et al.

(10) Patent No.: US 6,967,377 B2
(45) Date of Patent: Nov. 22, 2005

(54) DOUBLE-GATE FET WITH PLANARIZED SURFACES AND SELF-ALIGNED SILICIDES

(75) Inventors: Guy M. Cohen, Mohegan Lake, NY (US); Hon-Sum P. Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/629,014

(22) Filed: Jul. 29, 2003

(65) Prior Publication Data

US 2004/0023460 A1 Feb. 5, 2004

Related U.S. Application Data

(62) Division of application No. 09/690,875, filed on Oct. 18, 2000, now Pat. No. 6,642,115.

(60) Provisional application No. 60/204,384, filed on May 15, 2000.

(51) Int. Cl.[7] ............................................... H01L 27/01
(52) U.S. Cl. ...................... 257/348; 257/347; 257/350; 257/351; 438/157; 438/283
(58) Field of Search ............................. 257/348, 347, 257/350, 351; 438/283, 157

(56) References Cited

U.S. PATENT DOCUMENTS

| | | |
|---|---|---|
| 5,102,819 A | 4/1992 | Matsushita et al. |
| 5,120,666 A | 6/1992 | Gotou |
| 5,166,084 A | 11/1992 | Pfiester |
| 5,273,921 A | 12/1993 | Neudeck et al. |
| 5,371,401 A | 12/1994 | Kurita |
| 5,461,250 A | 10/1995 | Burghartz et al. |
| 5,497,019 A | 3/1996 | Mayer et al. |
| 5,646,058 A | 7/1997 | Taur et al. |
| 5,702,963 A * | 12/1997 | Vu et al. .................... 438/197 |
| 5,708,286 A | 1/1998 | Uesugi et al. |
| 5,773,331 A | 6/1998 | Solomon et al. |
| 5,923,963 A | 7/1999 | Yamanaka |
| 6,143,582 A | 11/2000 | Vu et al. |
| 6,281,084 B1 * | 8/2001 | Akatsu et al. .............. 438/301 |
| 6,346,446 B1 | 2/2002 | Ritenour |
| 6,365,465 B1 | 4/2002 | Chan et al. |

FOREIGN PATENT DOCUMENTS

JP 05-226655 9/1993

OTHER PUBLICATIONS

"Self-Aligned (Top and Bottom) Double-Gate MOSFET with a 25 nm Thick Silicon Channel", Hon-Sum Philip Wong, Kevin K. Chan, and Yuan Taur, IBM Thomas J. Watson Research Center, Yorktown Heights, NY, IEEE 1997, pp. 427-430.

New Planar Self-Aligned Double-Gate Fully-Depleted P-MOSFET's Using Epitaxial Lateral Overgrowth (ELO) and Selectively Grown Source/Drain (S/D), Taichi Su, John P. Denton, and Gerold W. Neudeck, IEEE School of Electrical and Computer Engineering, Purdue University, West Lafayette, IN, IEEE, 2000, pp. 110-111.

* cited by examiner

Primary Examiner—Steven Loke
Assistant Examiner—Samuel A. Gebremariam
(74) Attorney, Agent, or Firm—McGinn & Gibb, PLLC; Wan Yee Cheung, Esq.

(57) ABSTRACT

It is, therefore, an object of the present invention to provide a structure and method for an integrated circuit comprising a first gate, a second gate, and source and drain regions adjacent the first and second gates, wherein the structure has a planar upper structure and the first gate, source and drain regions are silicided in a single self-aligned process (salicide).

8 Claims, 7 Drawing Sheets

DOUBLE-GATE FET WITH PLANARIZED SURFACES AND SELF-ALIGNED SILICIDES

CROSS-REFERENCE TO RELATED APPLICATIONS

This application is a division of U.S. application Ser. No. 09/690,875 filed Oct. 18, 2000 now U.S. Pat. No. 6,642,115.

This patent claims the benefit of 60/204,384 filed May 15, 2000.

BACKGROUND OF THE INVENTION

1. Field of the Invention

The present invention generally relates to metal oxide semiconductor field effect transistors (MOSFETs) and more particularly to a double-gate MOSFET that has several advantages over conventional single-gate MOSFETs.

2. Description of the Related Art

It is conventionally known that a double-gate MOSFET has several advantages of over conventional single-gate MOSFET structures (dual-gates are side by side, while double-gates form a top and bottom gate structure). For example, the double-gate MOSFET structure has higher transconductance, lower parasitic capacitance and superior short-channel characteristics when compared to single-gate MOSFET structures. Various simulations have shown that a 30 nm channel double-gate MOSFET will show very high transconductance (2300 mS/mm) and very fast switching speeds. Moreover, good short-channel characteristics are obtained down to a 20 nm channel length, which does not require doping. Therefore, double-gate MOSFETs circumvent tunneling breakdown, and avoid the dopant quantization and impurity scattering associated with the conventional doping required in single-channel MOSFET structures.

However there is no conventional method of making a double-gate MOSFET structure which has both the top and bottom gate self-aligned to the source/drain suicides and which produces a planarized surface after the formation of the source/drain and gate structures. Conventional efforts to form a double-gate MOSFET structure generally fall into three categories.

One method etches silicon into a pillar structure and deposits gates around the pillar structure. However, with this method, it is difficult to form thin vertical pillars (e.g., 10 nm) that are free of reactive ion etching (RIE) damage and to maintain good thickness control.

Another method forms a conventional single-gate MOSFET and uses either selective epitaxy or bond-and-etch-back techniques to form the second gate. However, with this method, it is difficult to keep the top and bottom gate oxides at the same thickness and to align the gates with each other.

A third method begins with a thin SOI film, and patterns tunnels under the SOI film. Then, gate electrodes are deposited in the tunnel around the SOI film. However, this method also suffers silicon thickness control problems and gate alignment problems.

Therefore, there is a need for a method and structure of forming a doublegate MOSFET structure which provides a planarized surface after the formation of the source/drain and gate structures and which allows for the gate and source/drain suicides to be self-aligned.

SUMMARY OF THE INVENTION

It is, therefore, an object of the present invention to provide a structure and method for an integrated circuit having a first gate, a second gate, and source and drain regions adjacent the first and second gate wherein the first gate and the source and drain regions are silicided in a single self-aligned process. The integrated circuit has a channel region between the first gate and the second gate, conductors electrically connecting the first and the second gate, and an insulator above the first gate, and insulators between the channel region and the first gate and the second gate. The channel region includes channel extensions extending into the source and drain regions wherein the channel extensions have an arrow shape in cross-section.

The invention can also comprise a method for producing a double-gate metal oxide semiconductor field effect transistor which can form a laminated structure including forming a first sacrificial layer, forming a channel layer above the first sacrificial layer, and forming a second sacrificial layer above the channel layer. The method can also include removing the first sacrificial layer and the second sacrificial layer, depositing gate conductors around at least two sides of the channel layer, doping source and drain regions of the laminated structure, and forming an insulator between the channel layer and the first sacrificial layer and the second sacrificial layer. The method may also include forming conductors electrically connecting the gate conductors, forming source and drain regions adjacent the laminated structure, growing channel extensions into the source and drain regions, wherein the channel extensions have an arrow shape in cross-section. The removal of the first sacrificial layer and the second sacrificial layer leaves the channel layer as a bridge having open space above and below the channel layer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

As discussed above, the invention provides a structure and method for fabricating a double-gate field effect transistor (FET) with a planarized surface and with gate regions which are self-aligned to the source drain. The silicide regions over the gate, source and drain are formed in a single self-aligned (salicide) processing step. The planarized surface of the inventive structure is important for subsequent processing which needs a level surface.

Figure 1:
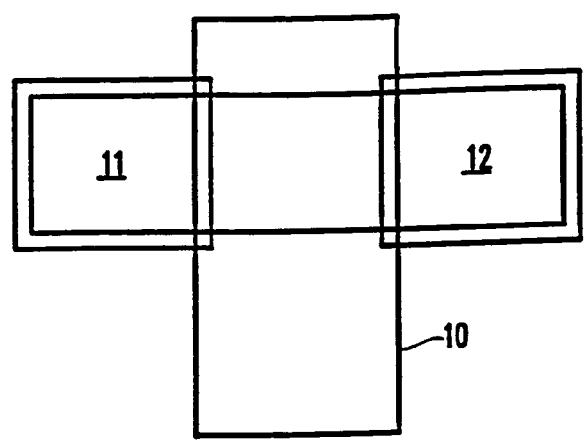
FIG. 1 is a schematic diagram depicting a top view of the device.

FIG. 1 illustrates a top view of the inventive structure which includes a gate 10 and source and drain and regions 11, 12. FIGS. 2–11 illustrate the various stages of production of the inventive structure and the process for forming the inventive structure. While a single process for the invention is disclosed below, as would be known by one ordinarily skilled in the art given this disclosure, many similar processes may be substituted at various points of the inventive method without departing from the concept of the invention to achieve a similar structure and the invention is intended to include all such similar processing steps and/or processing materials.

Figure 2:
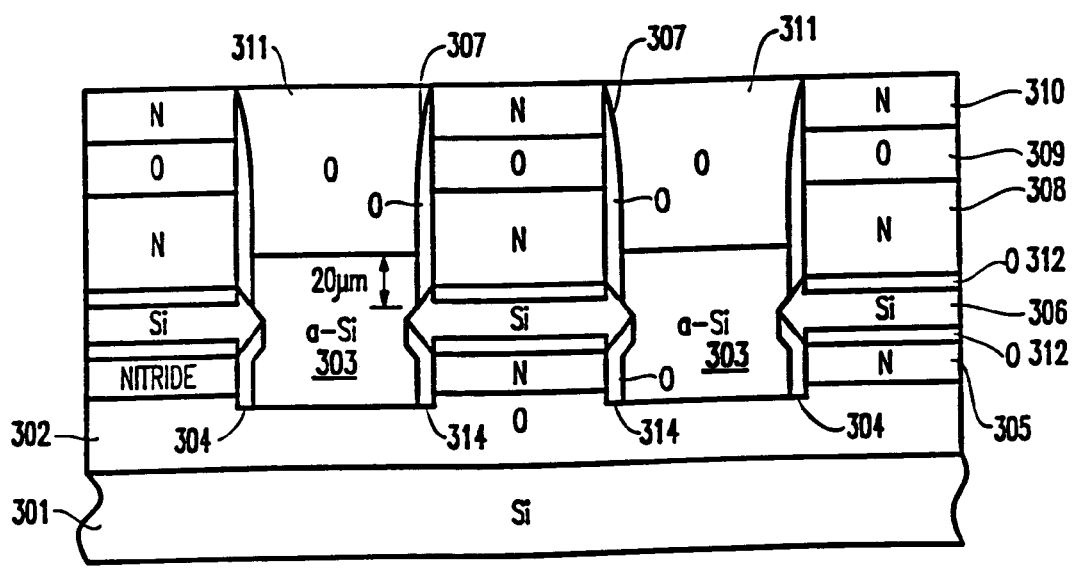
FIG. 2 is a schematic diagram depicting a cross-sectional view of the completed device.

More specifically, FIG. 2 illustrates a structure which is disclosed in co-pending U.S. Patent Application by K. K. Chan, G. M. Cohen, Y. Taur, and H.S. P. Wong, entitle "Self-Aligned Double-Gate MOSFET by Selective Epitaxy and Silicon Wafer Bonding Techniques", Ser. No. 09/272,297, filed Mar. 19, 1999 (hereinafter "Chan") incorporated herein by reference. The processing steps practiced to achieve the structure shown in FIG. 2 are described in Chan and are also summarized below:

By wafer bonding, a thin crystalline silicon 306 (the Si channel) is sandwiched between two pad oxides 312. On either sides of the top and bottom pad oxides there are nitride films 305 (bottom) and 308 (top). The bottom nitride film 305 is laid over an oxide film 302 which is referred to as the buried oxide or BOX. The BOX 302 is bonded to a silicon substrate 301 or any other handle substrate. An oxide film 302 is deposited over the top nitride 308, and another nitride film 310 is deposited over the oxide 309.

The source and drain holes 303 are defined by lithography and reactive ion etching (RIE). The RIE etches through the film stack and stop in the BOX 302. The silicon channel 306 is then extended into the source/drain holes 303 by selective epitaxy. The selective epitaxy uses the crystalline silicon 306 channel as a seed from which the channel extensions are grown in the form of arrows. The arrows stick out and thus facilitate the formation of the sidewall spacers 314 and 307. Low temperature oxide (LTO) sidewalls spacers 314 and 307 are formed by LTO deposition and RIE. The source and drain holes 303 are then filled by depositing amorphous silicon (a-Si) and are polished back using a selective chemical mechanical polishing (CMP) process which stops on the top nitride 310. The source and drain are recessed by a silicon RIE, which is selective to nitride. The recessed amorphous silicon plugs 303, are re-crystallized by annealing. A self-aligned implant is used to dope the source and drain silicon plugs 303. The recessed portion of the source and drain region 311 is then filled with LTO and polished back using a CMP process that stops on the top nitride 310.

When using CMP for planarization it is very useful to have a selective process that would remove one material but would hardly effect other materials. This is why CMP is said to be "chemical" and not just "mechanical". This property is very handy for making plugs such as the oxide plug 311 in the process discussed above. The source and drain holes are filled by an oxide deposition. If the deposited film is thick enough it would fill the hole completely. It would also cover the area outside the hole region (the nitride 310). Since the oxide deposition is partially conformal, the surface topography would follow to some extent the underlay surface, showing a dip where the source/drain holes are. The bottom of the dip would be higher than the underlay nitride 310 if a thick enough film was deposited. When CMP (which is selective to nitride) is used for planarization it removes the oxide mainly over the nitride 310 regions since these are the highest surface spots (think of conventional mechanical polishing). As the CMP process is continued it eventually removes all the oxide over the nitride regions. Since the CMP is said to be selective to nitride (due to the "chemical" properties of the process), the removal of additional material is practically stopped. The oxide that fills the source/drain regions would not be removed since the polishing pad is "held back" by the nitride regions. In this way the oxide over the nitride 310 regions is shaved leaving oxide plugs 311 in the source/drain holes.

Figure 3:
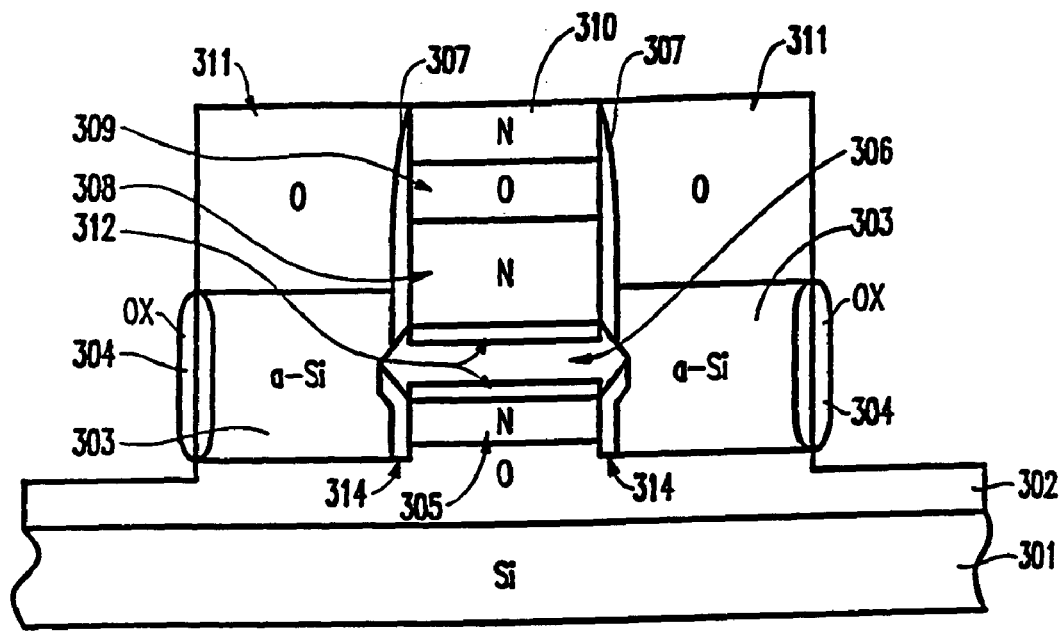
FIG. 3 is a schematic diagram depicting the device gate length cross-section after the active area etch.
Figure 4:
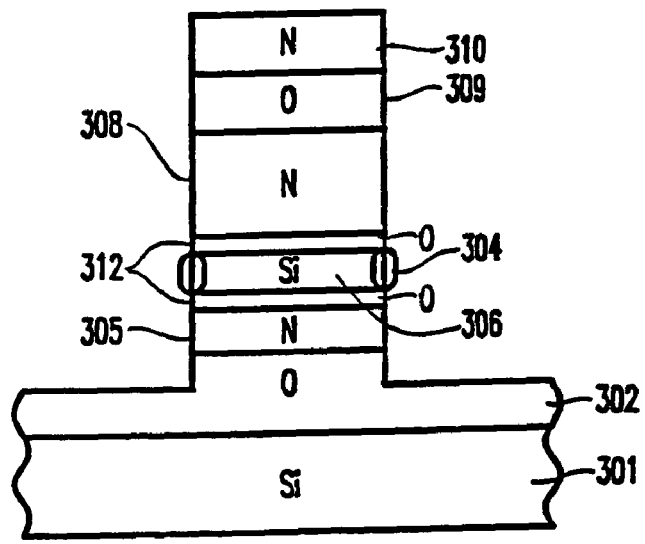
FIG. 4 is a schematic diagram depicting the device gate width cross-section of the structure shown in FIG. 3.

FIG. 3 illustrates the same structure from the gate length after patterning. FIG. 4 illustrates the same structure from the gate width direction after patterning. The patterning (by RIE) is used to define the device areas (a structure referred to as the mesa). The exposed silicon surfaces 304 and 306 are oxidized for isolation. The mesa etch also provides access to the bottom nitride 305. Hot phosphoric acid ($H_3PO_4$) is used to etch top nitrides 308, 310 and the bottom nitride 305, forming a suspended bridge of silicon channel 306 as well as a bridge of oxide 309 above the silicon channel.

Figure 5:
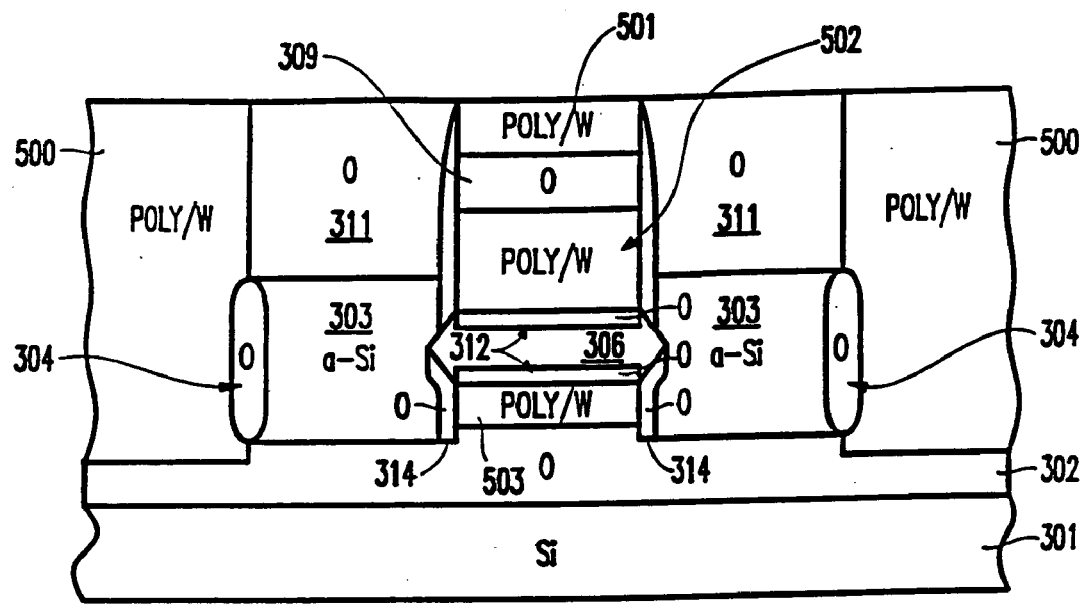
FIG. 5 is a schematic diagram depicting the device gate length cross-section after removal of nitride gate spaceholder, deposition of polysilicon or tungsten, and polishing.
Figure 6:
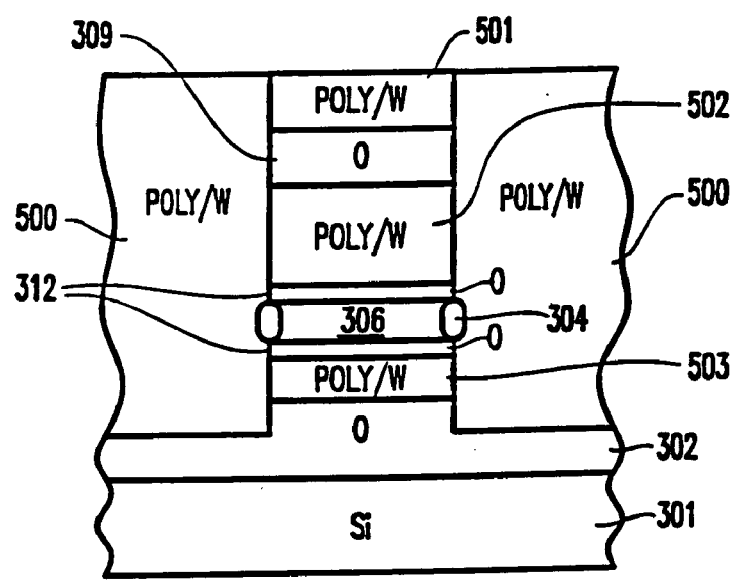
FIG. 6 is a schematic diagram depicting the device in FIG. 5 in the gate width cross-section.

In FIG. 5, a conductor such as polysilicon, tungsten, etc. is deposited to fill the areas vacated by the nitride regions. This forms the upper and lower gate conductors, 502, 503, an upper conductor region 501 and outer conductor regions 500. The same structure is shown in gate width cross-section in FIG. 6. After the conductor 500 is deposited, the structure is polished down to the oxide 311.

Figure 7:
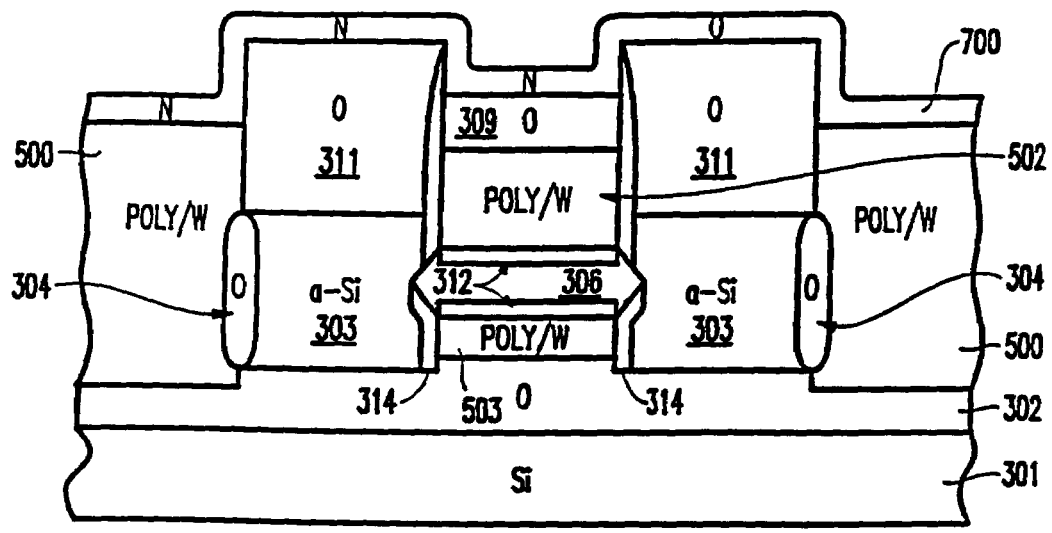
FIG. 7 depicting the device gate length cross-section after etching.
Figure 8:
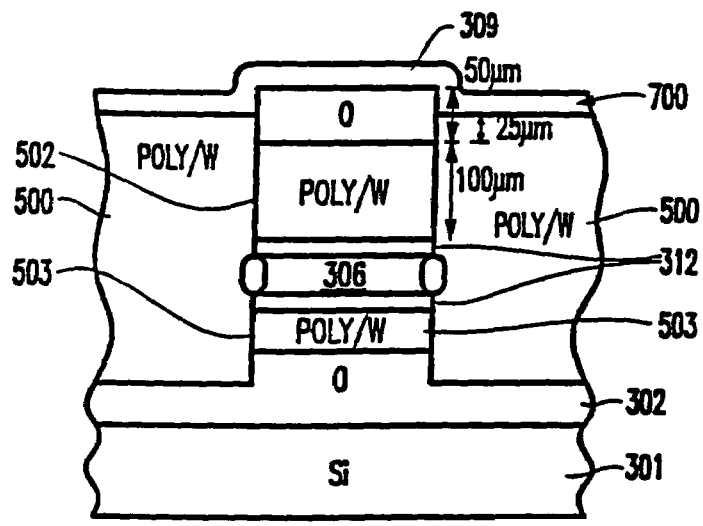
FIG. 8 is a schematic diagram depicting the device gate width cross-section of the device shown in FIG. 7.

In FIG. 7, the structure is subjected to a timed etch which removes the upper conductor 501 and portions of the side conductors 500. The etch may be carried out using a HBr based chemistry poly-Si RIE which is selective to oxide. Alternatively a wet etch such as KOH or TMAH could be used for polysilicon etching while $H_2O_2$ could be used to etch tungsten. After the etching, a nitride polish stop layer 700 is formed over the structure. The thickness of the nitride polish stop layer 700 depends upon the polishing and reactive ion etching (RIE) selectivity of the conductor 502, 503 to the nitride 700. For example, the layer 700 could be 50 nm thick. Once again, the same structure is shown in gate width cross-section in FIG. 8.

Figure 9:
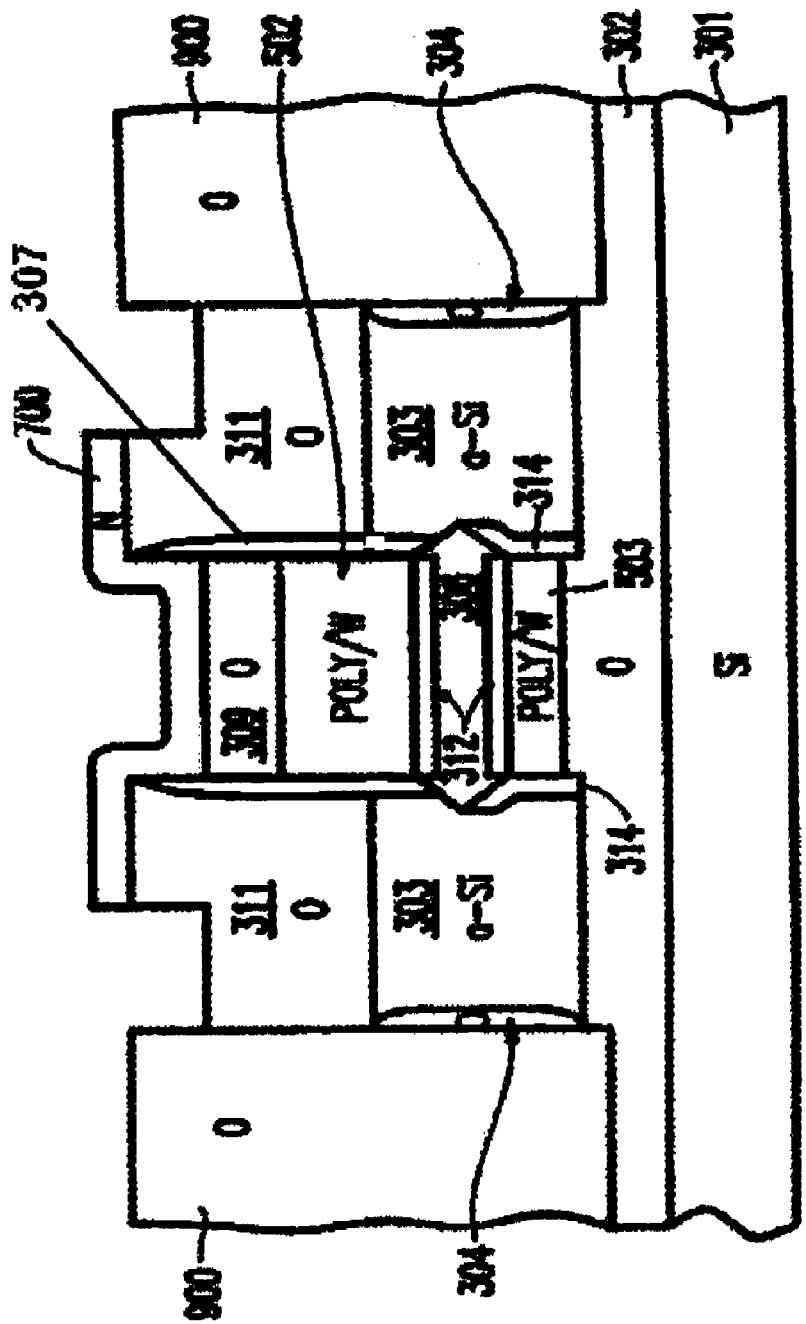
FIG. 9 is a schematic diagram depicting the device gate length cross-section after patterning the polysilicon.
Figure 10:
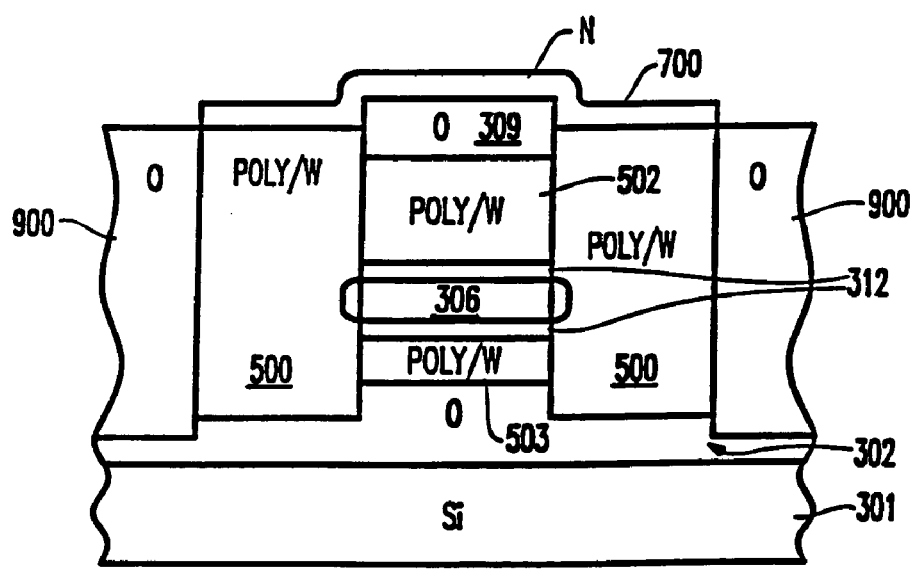
FIG. 10 is a schematic diagram depicting the device gate width cross-section of the device shown in FIG. 9.

In FIG. 9 (gate length cross-section) and FIG. 10 (width cross-section), the outer conductors 500 are removed using a selective etching process, such as a poly-Si RIE based on HBr chemistry, and are replaced with insulators 900 such as a low temperature oxide (LTO) insulators. The structure is then polished down to the nitride polish stop 700. The nitride 700 film is then etched in hot phosphoric acid.

Figure 11:
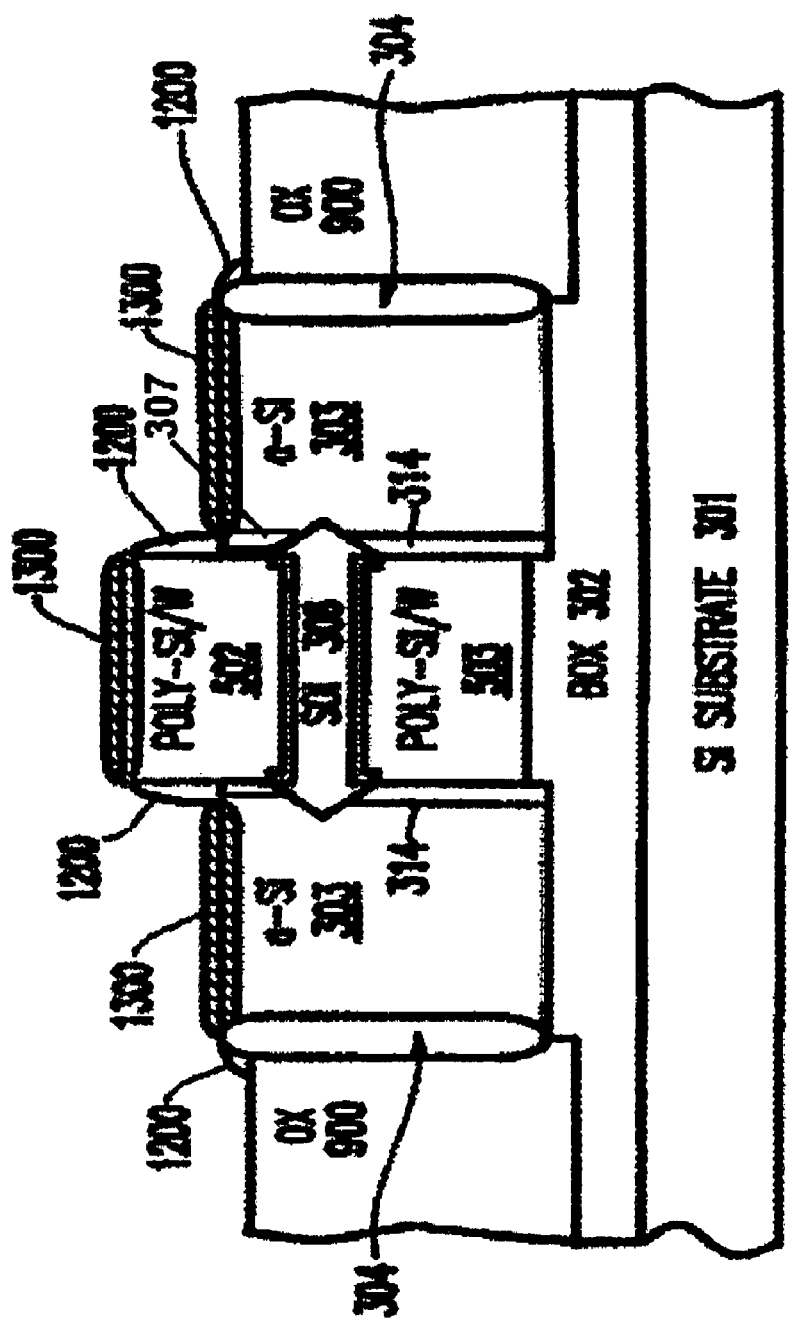
FIG. 11 is a schematic diagram depicting the device gate length cross-section after removal of the oxide, and silicidation of the upper gate conductor and the source/drain.

In FIG. 11, a reactive ion etching is applied to etch selectively the oxides 900, 311 and 309. The reactive ion etching stops when the oxide over the top poly gate 502 and the a-Si source/drain surfaces is cleared. While the oxides 311 and 309 are fully removed, the oxide 900 is not completely etched but may be slightly recessed with respect to the a-Si 303 top surface. An insulator film such as nitride or LTO is then deposited and spacers 1200 are formed by RIE at the gate edges. A conventional self-aligned silicide process is then used to silicide the exposed silicon surfaces. A silicide such as $CoSi_2$ 1300 is formed over the top poly-Si gate 502 and the source/drain regions 303. Finally an isolation oxide (not shown in the figure) is deposited to prepare for back-end metallization processes.

The implementation of the source and drain regions 303 which is carried out before the insertion of the LTO plugs 311, may be postponed and carried out just before the silicide process. This relieves some thermal budget constrains that are required to prevent dopant diffusion. In this embodiment, the self-aligned dopant implantation is carried out after the formation of the spacer 1200. The thickness of the spacers 1200 determines the offset of the implant. Following the implant, a rapid thermal annealing (RTA) is used to activate the dopants. As discussed in the main embodiment, a conventional self-aligned silicide process is then used to silicide the exposed silicon surfaces. The remaining process steps are unchanged.

While the invention has been described in terms of preferred embodiments, those skilled in the art will recognize that the invention can be practiced with modification within the spirit and scope of the appended claims. For example, while the invention has been described with reference to MOSFET structure, as would be known by one ordinarily skilled in the art given this disclosure, the invention is applicable to all similar integrated circuit devices including semiconductor devices, transistors and other field effect type devices.

What is claimed is:

1. A double gate transistor comprising:
   a channel region;
   a top gate above said channel region;
   a bottom gate below said channel region; and
   first spacers in direct contact with said top gate,
   wherein said spacers comprise lower spacers in direct contact with a lower section of said top gate and upper spacers in direct contact with an upper section of said top gate, and
   wherein said lower spacers comprises a different material than said upper spacers.

2. The transistor in claim 1, further comprising source and drain regions adjacent said top gate, wherein said lower spacers are adjacent said source and drain regions and said upper spacers are at a level above said source and drain regions.

3. The transistor in claim 1, wherein said upper spacers are above said channel region.

4. The transistor in claim 1, further comprising second spacers adjacent said bottom gate.

5. The transistor in claim 1, further comprising source and drain regions adjacent said lower section of said top gate.

6. A double gate transistor comprising:
   a channel region;
   a top gate above said channel region;
   a bottom gate below said channel region;
   first spacers in direct contact with said top gate, wherein said spacers comprise lower spacers in direct contact with a lower section of said top gate and upper spacers in direct contact with an upper section of said top gate;
   source and drain regions adjacent said top gate, wherein said lower spacers arc adjacent said source and drain regions; and
   silicide regions along upper portions of said source and drain regions,
   wherein said silicide regions are adjacent a point where said upper spacers meet said lower spacers, and
   wherein said lower spacers comprises a different material than said upper spacers.

7. The transistor in claim 6, wherein said upper spacers and said lower spacers are above said channel region.

8. The transistor in claim 6, further comprising second spacers adjacent said bottom gate.

* * * * *